United States Patent [19]

Ichimura et al.

[11] Patent Number: 4,519,660

[45] Date of Patent: May 28, 1985

[54] ELECTRICAL CONNECTORS WITH QUASI-TERMINAL PINS

[75] Inventors: Yoshiaki Ichimura; Atsuhito Noda; Tetsuro Tokaichi; Shoji Umesato, all of Tokyo, Japan

[73] Assignees: Japan Aviation Electronics Industry, Limited; NEC Corporation, both of Tokyo, Japan

[21] Appl. No.: 589,879

[22] Filed: Mar. 15, 1984

[30] Foreign Application Priority Data

Mar. 17, 1983 [JP] Japan .............................. 58-37471[U]

[51] Int. Cl.³ .......................................... H01R 13/629
[52] U.S. Cl. ................... 339/75 M; 339/17 CF; 339/75 MP
[58] Field of Search .......... 339/17 CF, 75 M, 75 MP, 339/176 M, 176 MP

[56] References Cited

U.S. PATENT DOCUMENTS

| | | | |
|---|---|---|---|
| 3,676,832 | 7/1972 | Judge et al. | 339/75 M |
| 3,915,537 | 10/1975 | Harris et al. | 339/176 R |
| 4,468,076 | 8/1984 | Hine et al. | 339/17 CF |

FOREIGN PATENT DOCUMENTS

| | | |
|---|---|---|
| 43199 | 1/1982 | European Pat. Off. |
| 83862 | 7/1983 | European Pat. Off. |
| 2028015 | 2/1980 | United Kingdom |

*Primary Examiner*—John McQuade

*Attorney, Agent, or Firm*—Laff, Whitesel, Conte & Saret

[57] ABSTRACT

An electrical connector for electrically connecting terminal pins of a circuit package to a circuitry of another circuit board having quasi-terminal pins for elastically pre-bending pairs of spring arms of contact elements in the connector. The connector is provided with an insulator base member for embracing the contact elements, and an insulator cover member slidably overlying the base member. The base member has recesses for permitting the spring arm pair to elastically bend. The cover member has penetrating holes for introducing the conductive pins into the recesses. The quasi-terminal pins are attached to the cover member adjacent to the penetrating holes, respectively, each of which is inserted between the spring arms and are in press-contact with them. Thus, the spring arms are pre-bent to facilitate an insertion of the terminal pin into a space between spring arms. The circuit package is adapted to the connector so that the terminal pins are introduced into the recesses through the penetrating holes. When the circuit package is slided along the base member, each of the terminal pins is laterally shifted to be inserted into a space between the spring arms and then each of quasi-terminal pins is shifted to go away from the spring arms. Therefore, the terminal pins are pinched between the spring arms to thereby be electrically connected to the contact elements. Preferably, each of the spring arms is provided with a guide leaf for guiding insertion of the quasi-terminal which is inserted thereinto.

13 Claims, 18 Drawing Figures

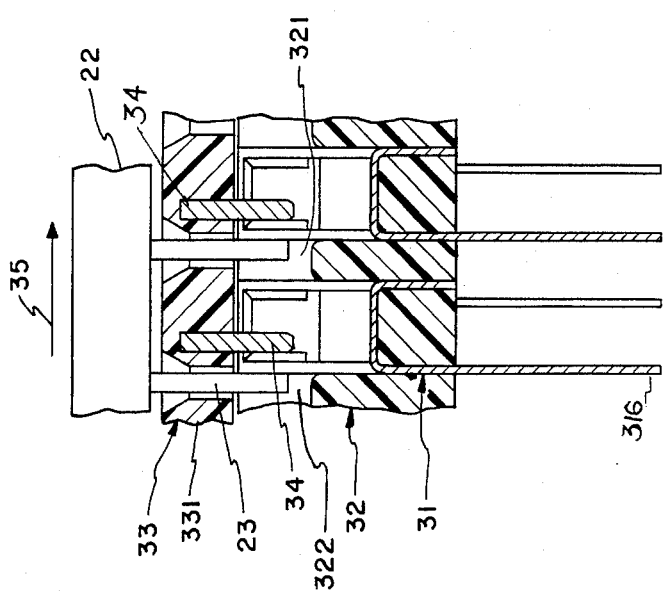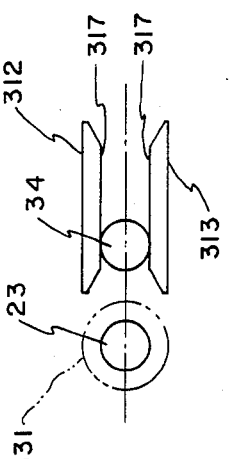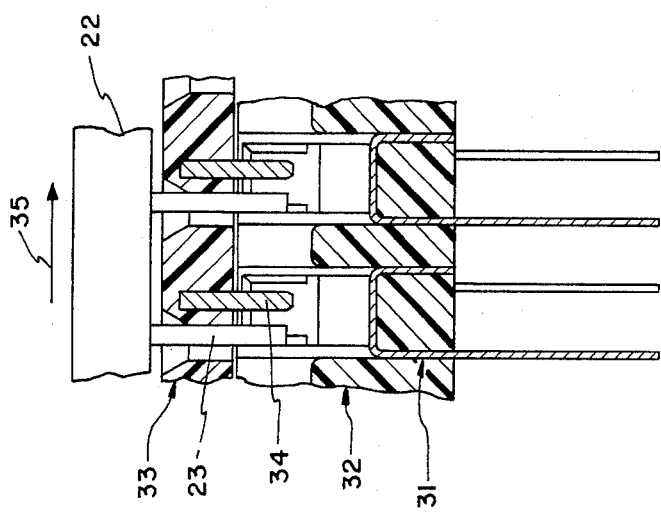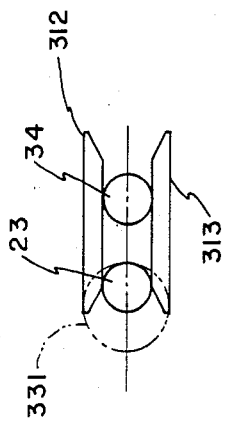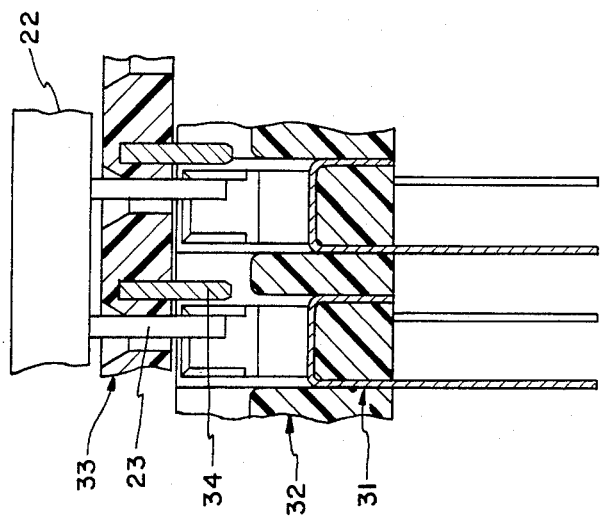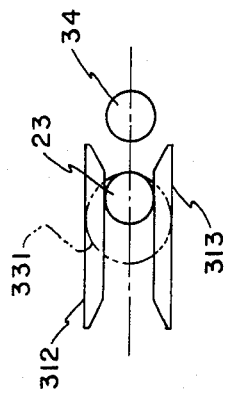

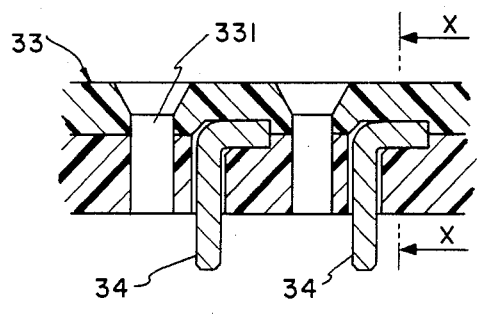
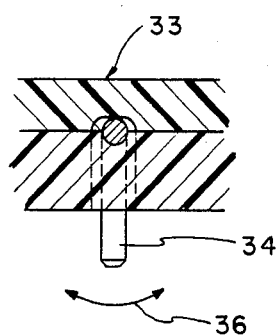
FIG. 9   FIG. 10
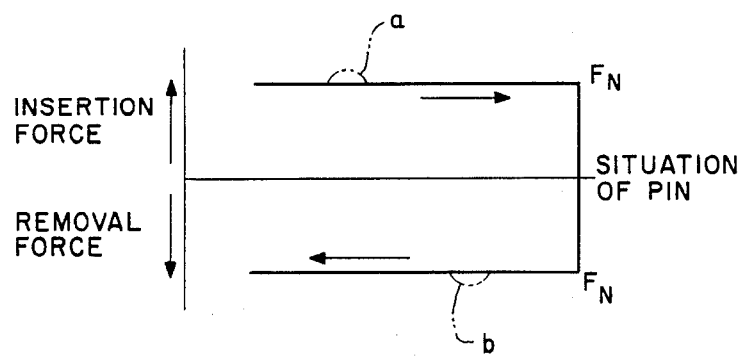
FIG. 8
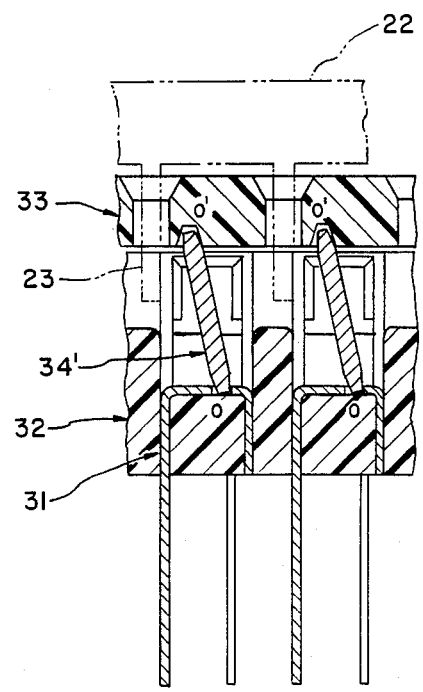
FIG. 11
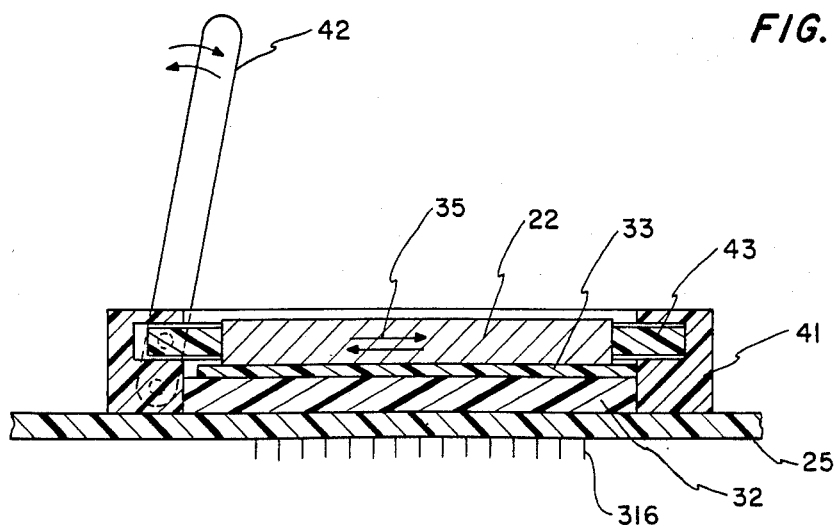
FIG. 15

ELECTRICAL CONNECTORS WITH QUASI-TERMINAL PINS

BACKGROUND OF THE INVENTION

This invention relates to electrical connectors, and in particular, to improvements in or relating to connectors for connecting a conductive terminal pin to an electrical circuit.

In order to removably or disengageably connect the terminal pin member with the electrical circuit with zero longitudinal insertion force, a connector was known in the prior art as disclosed in U.S. Pat. No. 3,915,537. The connector includes at least one contact element to be electrically connected at one end thereof to the electric circuit. The contact element has a pair of spring arms which extend upwardly to oppose one another with a space, and contact portions formed on free ends of respective spring arms. Confronting contact surfaces are formed at facing sides of the contact portions. A conductive terminal pin is laterally moved and introduced between the contact surfaces to thereby be frictionally and electrically connected with the contact element. That is, the spring arms are elastically bent outwardly by the terminal pin introduced between contact surfaces, and the contact surfaces are in press-contact with a peripheral surface of the terminal pin. In the connector, a large force is required for overcoming the elastic force of each spring arm to introduce the terminal pin between the contact surfaces.

In a connector for a dual in-line package (DIP) as shown in FIG. 5 of the above-mentioned U.S. patent, a number of contact elements are arranged for receiving a plurality of leads or terminal pins of the DIP and all of terminal pins are simultaneously connected to the corresponding contact elements. In such an instance, a very large force is required for moving the DIP to electrically connect the terminal pins with respective contact elements.

Furthermore, in such a connector for the DIP, a plurality of contact elements must be arranged in registry with terminal pins of the DIP. If not so, the reliable contact between the terminal pins and the contact elements is not always insured.

SUMMARY OF THE INVENTION

Accordingly, it is a principal object of this invention to provide an electrical connector in which a longitudinal insertion force is zero and a large force is not required in operation for electrically connecting a conductive terminal pin member to an electrical circuit.

It is another object of this invention to provide an electrical connector in which an electrical connection between the terminal pin and the contact element is always insured.

It is a still another object of this invention to provide an electrical connector for connecting a dual in-line package to a printed circuit board wherein connection between terminal pins of the DIP and contact elements is established without longitudinal insertion force and with reduced lateral insertion force.

It is yet another object of this invention to provide an electrical connector for the DIP in which a number of contact elements are arranged in high density.

It is a further object of this invention to realize the above-mentioned objects with simple constructions.

According to this invention, an electrical connector is obtained for electrically connecting a conductive terminal pin member to an electrical circuit. The connector includes a contact element being made of a conductive and resilient material. The contact element has a mounting stem to be electrically connected to said electric circuit, at least one spring arm and a contact portion formed at a free end of the spring arm. The contact portion has a contact surface at its one side thereof. The contact surface generally extends in lateral and longitudinal directions. A fixed insulator member is fixedly disposed in relation to the contact element. The fixed insulator has a recess for embracing therein the contact portion. An insulator cover member overlies the fixed insulator member and has a penetrating hole for receiving therein the conductive terminal pin member and guiding the conductive terminal pin member to be positioned adjacent the contact portion. The insulator cover member permits the conductive terminal pin member to laterally move towards the contact portion and in the lateral direction so as the effect frictional and electrical engagement of the conductive terminal pin member with the contact surface. The insulator cover member is slidable on the fixed insulator member so that the penetrating hole can move in the lateral direction from a first position offset from the contact portion to a second position right above the contact portion. Quasi-terminal pin means is provided so that a top end thereof is connected on the lower side surface of the cover member adjacent the penetrating hole. The quasi-terminal pin means is in press-contact with the contact surface in a condition that the penetrating hole is positioned offset from the contact portion.

In one aspect of this invention, an electrical connector for the dual in-line package (DIP) wherein a plurality of contact elements are arranged in the fixed insulator member corresponding to terminal pins of the DIP. The cover member has also a plurality of penetrating holes and a plurality of quasi-terminal pin means. The DIP is mounted on the cover member so that its terminal pins are positioned adjacent contact elements without longitudinal insertion force. Then, the DIP is laterally moved together with the cover plate so that terminal pins come into contact with the contact elements. The lateral insertion force is a reduced one because the contact elements are pre-loaded by the quasi-terminal pin means.

In another aspect of this invention, each contact element includes a pair of spring arms having respective contact portions with side contact surfaces. The contact surfaces face and are spaced from one another. The quasi-terminal pin means is disposed in a space between the facing contact surfaces and is in press-contact with the contact surfaces.

Further objects, features and other aspects of this invention will be understood from the following detailed description of preferred embodiments referring to the accompanying drawings.

BRIEF DESCRIPTION OF THE DRAWINGS

FIG. 5a is a sectional view of a main portion of the connector in FIG. 4, with the DIP being inserted into the connector;

FIG. 5b is an enlarged schematic plan view illustrating a relationship between a contact element, a quasi-terminal pin and a terminal pin in FIG. 5a;

FIG. 6a is a sectional view similar to FIG. 5a with the DIP being moved along an arrow 35;

FIG. 6b is an enlarged schematic plan view similar to FIG. 5b;

FIG. 7a is a sectional view similar to FIG. 5a with the DIP being completely connected to the connector;

FIG. 7b is an enlarged schematic plan view similar to FIG. 5b;

FIG. 8 is a diagram illustrating the lateral insertion and removal forces of a conductive terminal pin member into a contact element of the connector shown in FIG. 4;

FIG. 9 is a sectional view of a main portion of a cover member used in a connector of another embodiment of this invention;

FIG. 10 is a sectional view along a line X—X in FIG. 9;

FIG. 11 is a sectional view of a main portion of a connector of still another embodiment of this invention;

FIG. 15 is a sectional view of a driving device for moving the DIP, with the connector and a circuit board being illustrated.

DETAILED DESCRIPTION OF PREFERRED EMBODIMENTS

Figure 1:
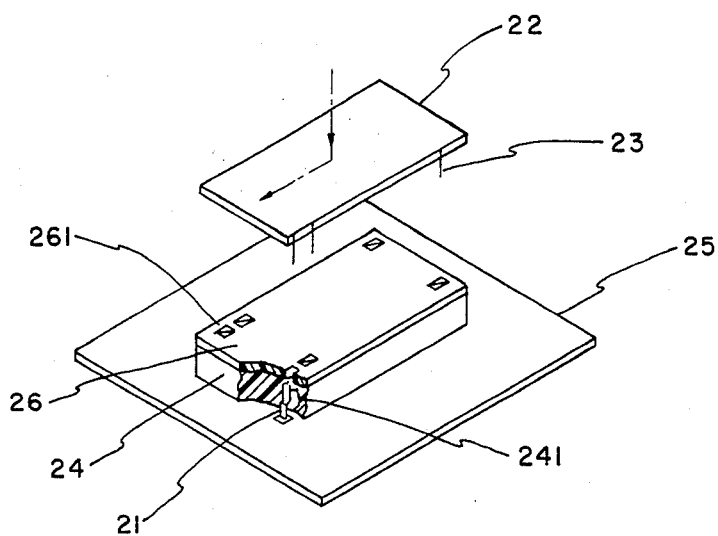
FIG. 1 is a partially exploded perspective view illustrating a dual in-line package (DIP) application utilizing a connector device known in the prior art.

Referring to FIG. 1, a known connector for a dual in-line package (DIP) has a number of conductive contact elements 21. The standard DIP 22 contains therein miniature internal circuitry. Electrical contact to the internal circuitry is made through a plurality of conductive lead or terminal pin members 23 extending laterally from the sides of DIP 22. Terminal pin members 23 will provide two substantially parallel rows. A housing 24 of a plastic resin and the like, having parallel rows of recesses 241 therein adapted to embrace contact elements 21, is attached to a printed circuit board 25. Each of contact elements 21 in housing 24 is electrically connected to circuitry on printed circuit board 25. A pin guide cover 26 having parallel rows of rectangular shaped apertures 261 therein overlies housing 24 and functions as a protective element for contact elements 21. Obviously, DIP 22 can be attached to printed circuit board 25 by longitudinally introducing pin member 23 into respective apertures 261 in pin guide cover 26 and then laterally slidably moving DIP 22 to effect electrical engagement of terminal pin members 23 into electrical contact with contact elements 21 within housing 24.

Figure 2:
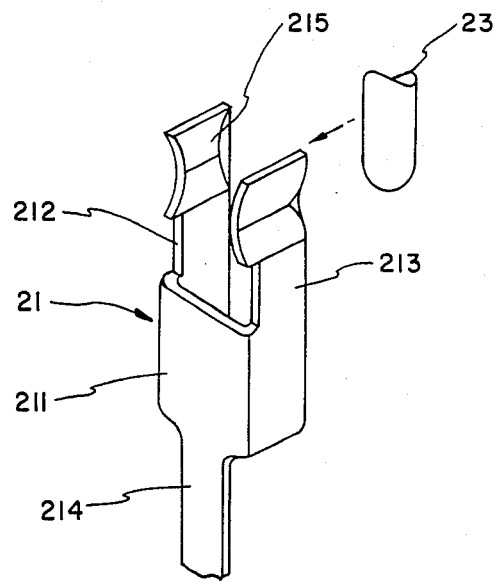
FIG. 2 is a perspective view of a contact element used in FIG. 1, which is shown associated with a conductive terminal pin member.

Referring to FIG. 2, each contact element 21 comprises a U-shaped yoke 211, a pair of spring arms 212 and 213 extending upwardly from the parallel facing arms of the yoke, and a mounting post or stem 214 extending downwardly from the central portion of the yoke. Terminal pin member 23 is laterally slidably inserted between spring arms 212 and 213 from the side opposite yoke 211. As a result, contact surfaces 215 of spring arms 212 and 213 are in press-contact with a peripheral surface of pin member 23.

In the known connector, no longitudinal force is required for inserting terminal pins 23 into the connector. However, a considerable large lateral force is required for introducing each terminal pin 23 to engage with contact surfaces 215 of the corresponding contact element 21. Because a space of confronting contact surfaces 215 is designed to be smaller than the diameter of terminal pin 23 so that terminal pin 23 is in press-contact with contact surfaces 215.

Figure 3:
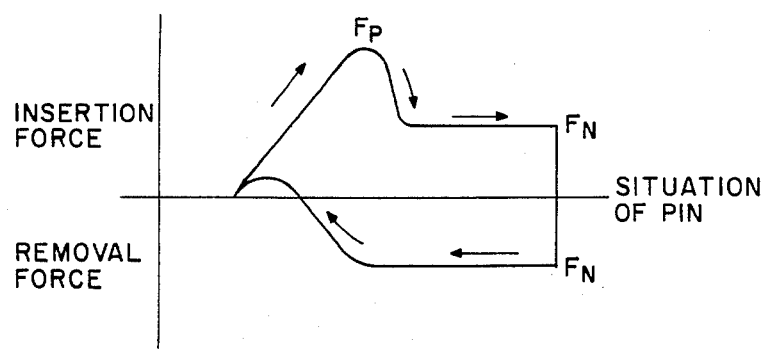
FIG. 3 is a diagram illustrating the lateral insertion and removal forces of a conductive terminal pin member in the connector device shown in FIG. 1.

Referring to FIG. 3, a maximum force $F_P$ is required at an initial state of terminal pin insertion between confronting contact surfaces 215 because the space between the confronting contact surfaces 215 must be spread. Thereafter, the terminal pin 23 is moved by a reduced force $F_N$ which is equal to a frictional force of the contact surfaces 215 and the terminal pin 23.

In removing terminal pin 23 from engagement with contact surfaces 215, the lateral force $F_N$ corresponding to the frictional force is only required.

A main object of this invention is to provide such a connector having a reduced lateral insertion force.

Figure 4:
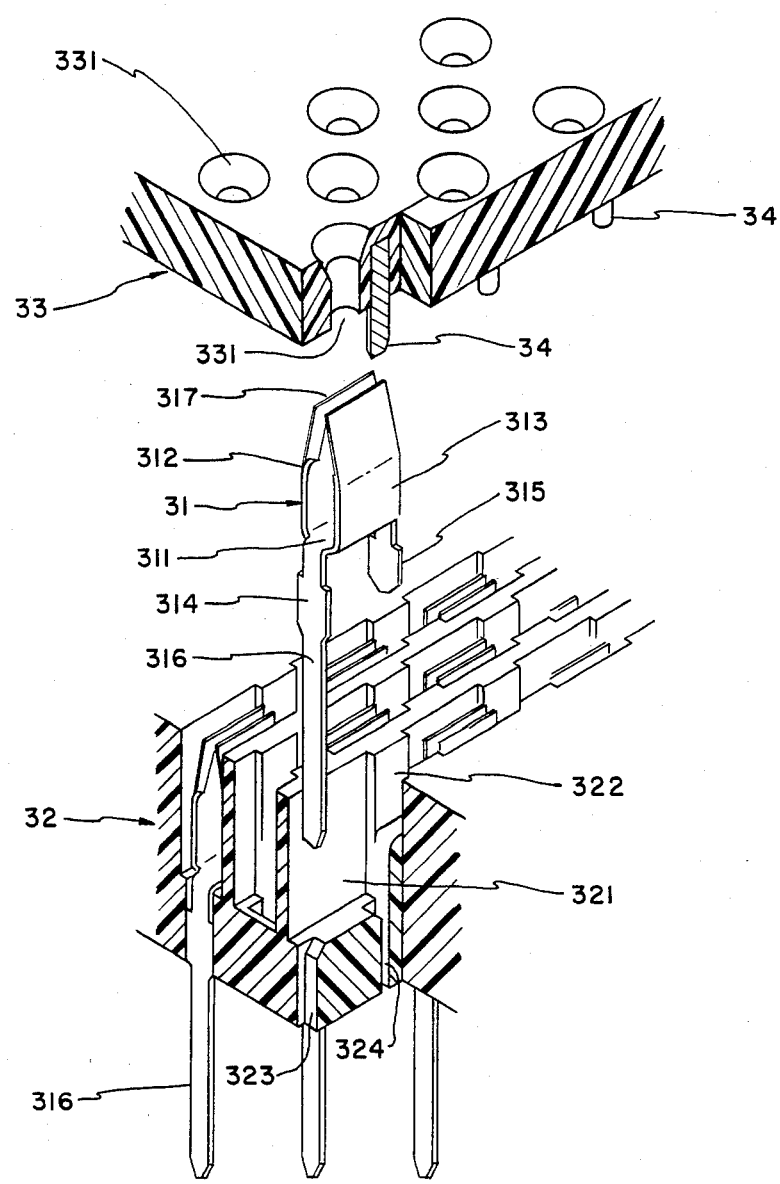
FIG. 4 is an exploded fragmentary perspective view of an electric connector of one embodiment of this invention.

Referring to FIGS. 4, 5a and 5b, a connector of an embodiment of this invention shown therein includes a number of contact elements 31 made of a conductive and elastic plate, a fixed insulator member 32 to be fixedly disposed on a printed circuit board 25 as shown in FIG. 1, and a movable insulator cover member 33 slidably overlying fixed insulator member 32.

Each of the contact elements 31 comprises a flat yoke 311, a pair of spring arms 312 and 313 extending upwardly from both sides of the yoke, a pair of mounting posts 314 and 315 extending downwardly from the other both sides of the yoke, and a connecting terminal 316 extending downwardly from the free end of one of the mounting posts.

The fixed insulator member 32 has in a top surface thereof a number of parallel rows of recesses 321, and grooves 322 formed in partitioning walls between adjacent recesses 321 in each row. A pair of rectangular holes 323 and 324 is formed in a bottom wall of each recess 321. The recesses 321 are adapted to embrace therein contact elements 31, respectively. That is, each of the contact elements 31 is assembled into fixed insulator member 32 so that mounting posts 314 and 315 are inserted into holes 323 and 324, respectively. The yoke 311 is seated on the bottom wall of the recess 321. The pair of spring arms 312 and 313 is entirely contained in recess 321 so that a space between the spring arms 312 and 313 can be spread. The mounting posts 314 and 315 are engaged with the walls of the holes 314 and 315 to thereby fixedly secured therein. The connecting terminal 316 straightly projects from a bottom surface of fixed insulator member 32 so as to be connected to an electrical circuit of printed circuit board 25 by a soldering process.

The cover member 33 has a number of circular penetrating holes 331 for receiving therein the terminal pin members 23 of the DIP 22 as shown in FIG. 1. The penetrating holes 331 are formed with parallel rows in registry with recesses 321.

The connector further includes a number of quasi-terminal pins 34 fixedly connected to the cover member 33 adjacent the penetrating holes 331. The quasi-terminal pins 34 are made of a metal or a plastic resin and protrude from the lower side surface of the cover member 33 into the recesses 321 of fixed insulator member 32, respectively, to thereby be inserted between both spring arms 312 and 313. As a result, parallel contact surfaces 317 of spring arms 312 and 313 are in press-contact with peripheral surface of quasi-terminal pins 34. Each of the quasi-terminal pins 34 has a diameter substantially equal to a diameter of terminal pin 23 of DIP 22.

Referring to FIGS. 5a and 5b, DIP 22 is disposed on an upper side surface of cover member 33 so that conductive terminal pin members 23 are inserted into the respective penetrating holes 331. The free ends of terminal pin members 23 are introduced into the grooves 322 of fixed insulator member 32 through penetrating holes 331. According to this construction, it will be understood that the longitudinal insertion of the pin members 23 can be very easily carried out without any insertion force.

As DIP 22 is then shifted along an arrow 35, the cover insulator member 33 is shifted in the same direction by the pin members 23. As a result, quasi-terminal pins 34 laterally move along the parallel contact surfaces 317 of contact elements 31. The terminal pin members 23 are also inserted between the parallel contact surfaces 317 of respective contact elements 31, as shown in FIGS. 6a and 6b. Any large force is not required to insert terminal pin members 23 between respective parallel contact surfaces 317, because spaces between respective parallel contact surfaces 317 are pre-spreaded to be substantially equal to the diameter of terminal pin members 23 by the quasi-terminal pin 34.

After that, as DIP 22 is further shifted along arrow 35 as shown in FIGS. 7a and 7b, the quasi-terminal pins 34 are removed from respective parallel contact surfaces 317. As a result, the parallel contact surfaces 317 are in press-contact with the pin member 23, therefore a reliable electrical and frictional connection between the terminal pin and the contact element is obtained.

The inserted pin member 23 can be readily removed by moving DIP 22 in a direction opposite to the arrow 35.

It will be noted that the sliding movement of cover member 33 along the arrow 35 is guided by the engagement of pin members 23 and/or quasi-terminal pin 34 with contact element 31.

It will be understood that insertion and removal of terminal pins can be carried out by similar small forces overcoming the frictional forces between the contact element and the terminal pin and/or the quasi-terminal pin, because the contact element is pre-loaded by the quasi-terminal pin so that the terminal pin can be introduced into a space between contact surfaces without a large force to spreading the confronting contact surfaces.

FIG. 8 shows the insertion force and a removal force of the terminal pin in relation to an amount of movement of the DIP 22. Referring to FIG. 8, either insertion or removal can be carried out by a very small force which is equal to a frictional force $F_N$ between the terminal pin or the quasi-terminal pin and the contact element, except for one point (a) in which terminal pin members 23 are inserted into spaces between respective parallel contact portions 317 and other point (b) in which the quasi-terminal pins 34 are inserted thereinto. A force required for insertion and removal is slightly increased in the points (a) and (b), because terminal pin member 23 and quasi-terminal pin 34 go into a space between confronting contact surfaces 317 at an initial time of the insertion and the removal of the terminal pin, respectively.

In view of the purpose of the quasi-terminal pin, it is necessary that both of terminal pin member 23 and quasi-terminal pin 34 exist between two parallel contact surfaces 317 temporarily at an initial time of the insertion or the removal of terminal pin from contact element. In order to reduce the frictional force, the quasi-terminal pin 34 may be preferably made of a material of a small coefficient of friction. An outline of the cross section of the quasi-terminal pin 34 is circular, however, may be oval as shown by a chain line in FIG. 14.

Referring to FIGS. 9 and 10, each of quasi-terminal pins 34 is preferably supported at one end thereof to cover member 33 so as to be swingable along an arrow 36. According to this arrangement, a free end portion of each of quasi-terminal pins 34 is automatically adjusted to be easily inserted between the parallel contact surfaces 317 even if the quasi-terminal pin and the contact element are erroneously positioned to be slightly offset from one another.

In the above-mentioned embodiments, the quasi-terminal pins 34 are supported by the cover member 33 at one end thereof. However, quasi-terminal pins 34' can be pivotally supported at both ends o-o' thereof by the fixed insulator member 32 and the cover member 33, as shown in FIG. 11.

Figure 14:
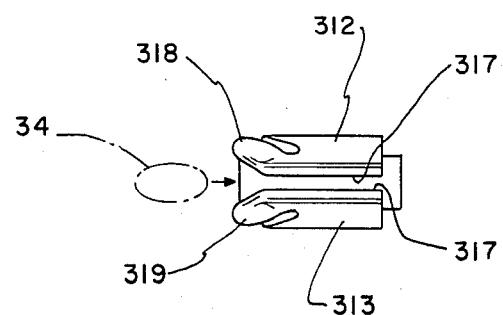
FIG. 14 is a plan view of the contact element shown in FIG. 12.
Figure 13:
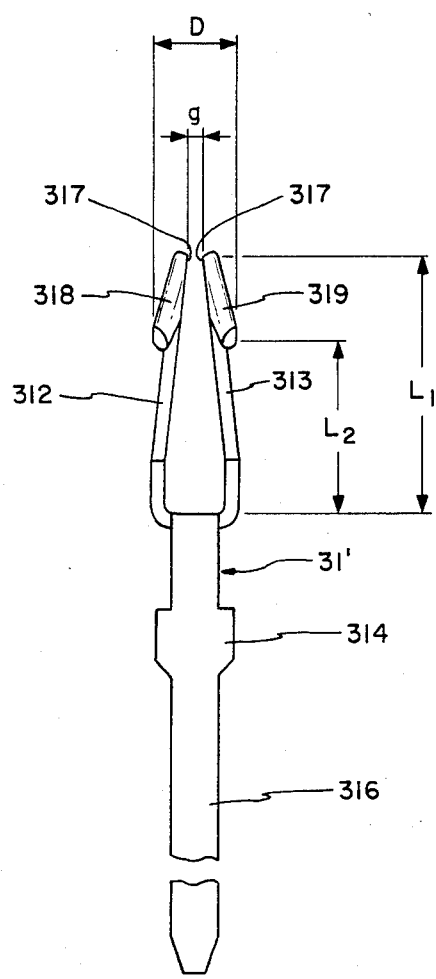
FIG. 13 is a side view of the contact element shown in FIG. 12.
Figure 12:
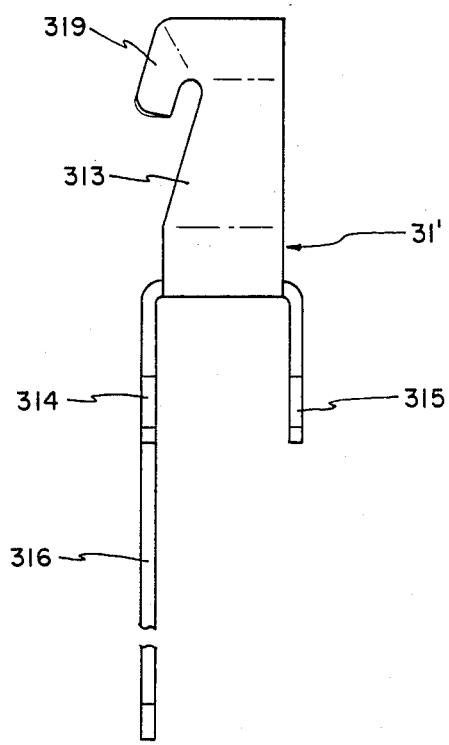
FIG. 12 is an elevation view of a contact element used in a connector of another embodiment of this invention.

Referring to FIGS. 12, 13 and 14, another embodiment of a contact element 31' shown therein is useful for the electrical connector according to this invention. The contact element 31' includes a pair of guide leaves 318 and 319 which is integral with a pair of contact portions. The guide leaves 318 and 319 face one another to guide the quasi-terminal pin 34 into the parallel contact surfaces 317. Each of the guide leaves 318 and 319 is additionally provided at a side edge adjacent a free end of each of the spring arms 312 and 313 and extends downwardly to recede in relation to the contact surface 317. According to this constructions, since a distance $L_1$ between the yoke 311 and the top end of contact surface 317 is longer rather than a distance $L_2$ between the yoke 311 and a free end of the guide leaf of 318 and 319, an amount of increase of a dimension D between the lower ends of guide leaves 318 and 319 is less than that of a dimension g between the top ends of the contact surfaces 317 when the quasi-terminal pin 34 is inserted into a space between contact surfaces 317 to spread the space. Therefore, a space required for mounting contact element 31' is comparatively small in spite of provision of guide leaves, so that a connector having contact elements at a high density can be obtained.

Although the contact elements 31 and 31' having a pair of confronting spring arms is used in the above embodiments, a contact element having a single spring arm may be used in the connector according to this invention.

In order to drive the DIP 22, a driving device shown in FIG. 15 is used. The driving device includes a first frame member 41 fitted around the fixed insulator member 32 and disposed onto the printed circuit board 25, a lever 42 pivotally connected to the first frame member 41, and a second frame member 43 mounted in the first frame member 41 so as to be slidable along the predetermined direction 35 and pivotally connected to the lever 42. The DIP 22 is fitted into an interior of the second frame 43. Then, upon turning lever 42 in one direction, DIP 22 is moved so that terminal pins are brought to engage with contact elements. Turning lever 42 in the opposite direction disengages terminal pins from contact elements.

What is claimed is:

1. In an electrical connector for electrically connecting a conductive terminal pin member to an electrical circuit, said electric connector including a contact element being made of a conductive and resilient material, said contact element having a mounting stem to be electrically connected to said electric circuit, at least one spring arm and a contact portion formed at a free end of said spring arm, said contact portion having a contact surface at one side thereof, said contact surface generally extending in lateral and longitudinal directions, a fixed insulator member being fixedly disposed in relation to said contact element, said fixed insulator member having a recess for embracing therein said contact portion, an insulator cover member overlying said fixed insulator member and having a penetrating hole for receiving therein said conductive terminal pin member and guiding said conductive terminal pin member to be positioned adjacent said contact portion, said insulator cover member permitting said conductive terminal pin member to laterally move towards said contact portion and in said lateral direction so as to effect frictional and electrical engagement of said conductive terminal pin member with said contact surface, the improvement which comprises said insulator cover member being slidable on said fixed insulator member so that said penetrating hole can move in said lateral direction from a first position offset from said contact portion to a second position right above said contact portion, and quasi-terminal pin means having a top end connected with a bottom surface of said cover member adjacent said penetrating hole, said quasi-terminal pin means being in press-contact with said contact surface in a condition that said penetrating hole is positioned offset from said contact portion.

2. The electrical connector as claimed in claim 1, wherein said contact element includes a pair of spring arms having respective contact portions with side contact surfaces, said contact surfaces facing and being spaced from one another, said quasi-terminal pin means being disposed in a space between said facing contact surfaces and being in press-contact with said contact surfaces.

3. The electrical connector as claimed in claim 1, wherein said contact portion having guide leaf means at one end side thereof, said guide leaf means being integrally connected to a top end of said contact portion and extending downwardly to recede in relation to said contact surface, said guide leaf means guiding reliably said terminal pin into electrical connection with said contact surface in the course of the lateral movement of said terminal pin.

4. The electrical connector as claimed in claim 1, wherein said quasi-terminal pin means is fixedly connected to said insulator cover member.

5. The electrical connector as claimed in claim 1, wherein said quasi-terminal pin means is slightly movable in a direction perpendicular to said contact surface.

6. The electrical connector as claimed in claim 1, wherein said quasi-terminal pin means is connected to said cover member so as to be swingable in a plane perpendicular to said contact surface.

7. The electrical connector as claimed in claim 1, wherein opposite ends of said quasi-terminal pin means are pivotally supported by said cover member and said fixed insulator member.

8. The electrical connector as claimed in claim 1, wherein an outline of a cross section of said quasi-terminal pin means is circular.

9. The electrical connector as claimed in claim 1, wherein an outline of a cross section of said quasi-terminal pin means is oval.

10. The electrical connector as claimed in claim 1, wherein said quasi-terminal pin means has a size equal to said conductive terminal pin member in a direction perpendicular to said contact surface.

11. In an electrical connector for electrically connecting a dual in-line package having a plurality of conductive terminal pin members projected from one surface thereof to an electrical circuit of a printed circuit board, said electrical connector including a plurality of contact elements being made of conductive and resilient materials, each of said contact elements having a mounting stem to be electrically connected to said electric circuit, at least one spring arm and a contact portion formed at a free end of said spring arm, said contact portion having a contact surface at one side thereof, said contact surface generally extending in lateral and longitudinal directions, a fixed insulator member being fixedly disposed in relation to said contact elements, said fixed insulator member having a plurality of recesses each for embracing therein said contact portion, an insulator cover member overlying said fixed insulator member and having a plurality of penetrating holes each for receiving therein said conductive terminal pin member and guiding said conductive terminal pin member to be positioned adjacent said contact portion, said insulator cover member permitting each of said conductive terminal pin members to laterally move towards said contact portion and in said lateral direction so as to effect frictional and electrical engagement of said conductive terminal pin member with said contact surface, the improvement which comprises said insulator cover member being slidable on said fixed insulator member so that each said penetrating hole can move in said lateral direction from a first position offset from said contact portion to a second position right above said contact portion, and a plurality of quasi-terminal pin means each having top ends connected with a bottom surface of said cover member adjacent said penetrating holes, each of said a plurality of quasi-terminal pin means being in press-contact with said contact surface in a condition that each of said penetrating holes is positioned offset from said contact portion.

12. The electrical connector as claimed in claim 11, wherein each of said contact elements includes a pair of spring arms having respective contact portions with side contact surfaces, said contact surfaces facing and being spaced from one another, each of said a plurality of quasi-terminal pin means being disposed in a space between said facing contact surfaces and being in press-contact with said contact surfaces.

13. The electrical connector as claimed in claim 11, wherein said connector further includes a first frame member fitted around said fixed insulator member and disposed onto said printed circuit board, a lever pivotally connected to said first frame member, and a second frame member for holding said dual in-line package therein, said second frame member being slidably mounted in said first frame member so as to be moved along said lateral direction by a pivotal motion of said lever whereby said dual in-line package is moved together with said second frame member to engage or disengage said conductive terminal pin members from said contact elements.

* * * * *